United States Patent [19]
Schüppen et al.

[11] Patent Number: 5,821,149
[45] Date of Patent: Oct. 13, 1998

[54] METHOD OF FABRICATING A HETEROBIPOLAR TRANSISTOR

[75] Inventors: Andreas Schüppen, Ulm; Harry Dietrich, Kirchardt; Ulf König, Ulm, all of Germany

[73] Assignees: Daimler Benz AG, Stuttgart; Temic Telefunken, Heilbronn, both of Germany

[21] Appl. No.: 815,010

[22] Filed: Mar. 14, 1997

[30] Foreign Application Priority Data

Mar. 14, 1996 [DE] Germany ......................... 196 09 933.1

[51] Int. Cl.$^6$ ................................................. H01L 21/331
[52] U.S. Cl. ........................... 438/312; 438/315; 438/320; 438/321
[58] Field of Search ..................................... 438/312, 313, 438/315, 317, 320, 321; 257/197

[56] References Cited

U.S. PATENT DOCUMENTS

| | | | |
|---|---|---|---|
| 5,198,689 | 3/1993 | Fujioka | 257/197 |
| 5,250,448 | 10/1993 | Hamasaka et al. | 438/312 |
| 5,328,858 | 7/1994 | Hikida . | |
| 5,346,840 | 9/1994 | Fujioka | 438/312 |
| 5,399,511 | 3/1995 | Taka et al. | 438/311 |
| 5,424,227 | 6/1995 | Dietrich et al. . | |
| 5,440,152 | 8/1995 | Yamazaki | 257/197 |
| 5,587,327 | 12/1996 | König et al. . | |

FOREIGN PATENT DOCUMENTS

| | | |
|---|---|---|
| 0 507 454 A1 | 10/1992 | European Pat. Off. . |
| 0 607 836 A2 | 7/1994 | European Pat. Off. . |
| 0 684 639 A1 | 11/1995 | European Pat. Off. . |

OTHER PUBLICATIONS

Jpn. J. Appl. Phys. vol. 33 (1994) pp. L 1139–L1141, Part 2, No. 8B, 15 Aug. 1994, Low Thermal Budget Polycrystalline Silicon–Germanium Thin–Film Transistors Fabricated by Rapid Thermal Annealing.

IEEE Transactions on Electron Devices, vol. 41, No. 3, Mar. 1994, pp. 427–432, SiGe Drift Base Bipolar Transistor with Self–Aligned Selective CVD–Tungsten Electrodes.

*Primary Examiner*—Tuan H. Nguyen
*Attorney, Agent, or Firm*—Spencer & Frank

[57] ABSTRACT

A method of fabricating an HBT using differential epitaxy. By using an emitter mask and an exside-inside spacer structure, a self-aligned fabrication of an emitter contact and a base contact is carried out. The emitter contact layer is made from amorphous silicon. Since the entire process sequence is very temperature-stable and can be carried out at lower implantation energies than conventional methods, HBT's having a high layer quality can be fabricated by the method of the invention which is suitable for mass production and with which high oscillation frequencies can be accomplished.

10 Claims, 6 Drawing Sheets

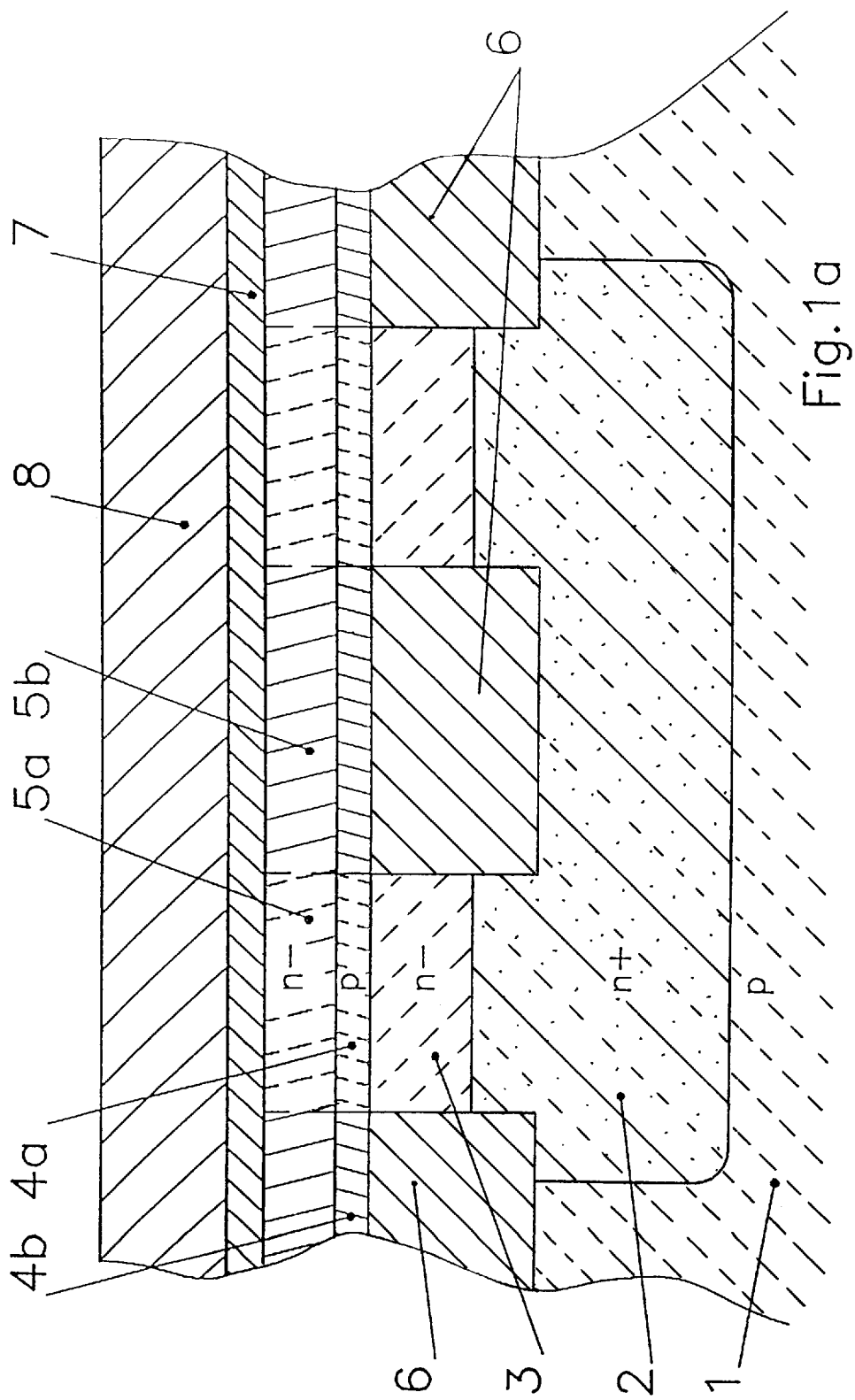

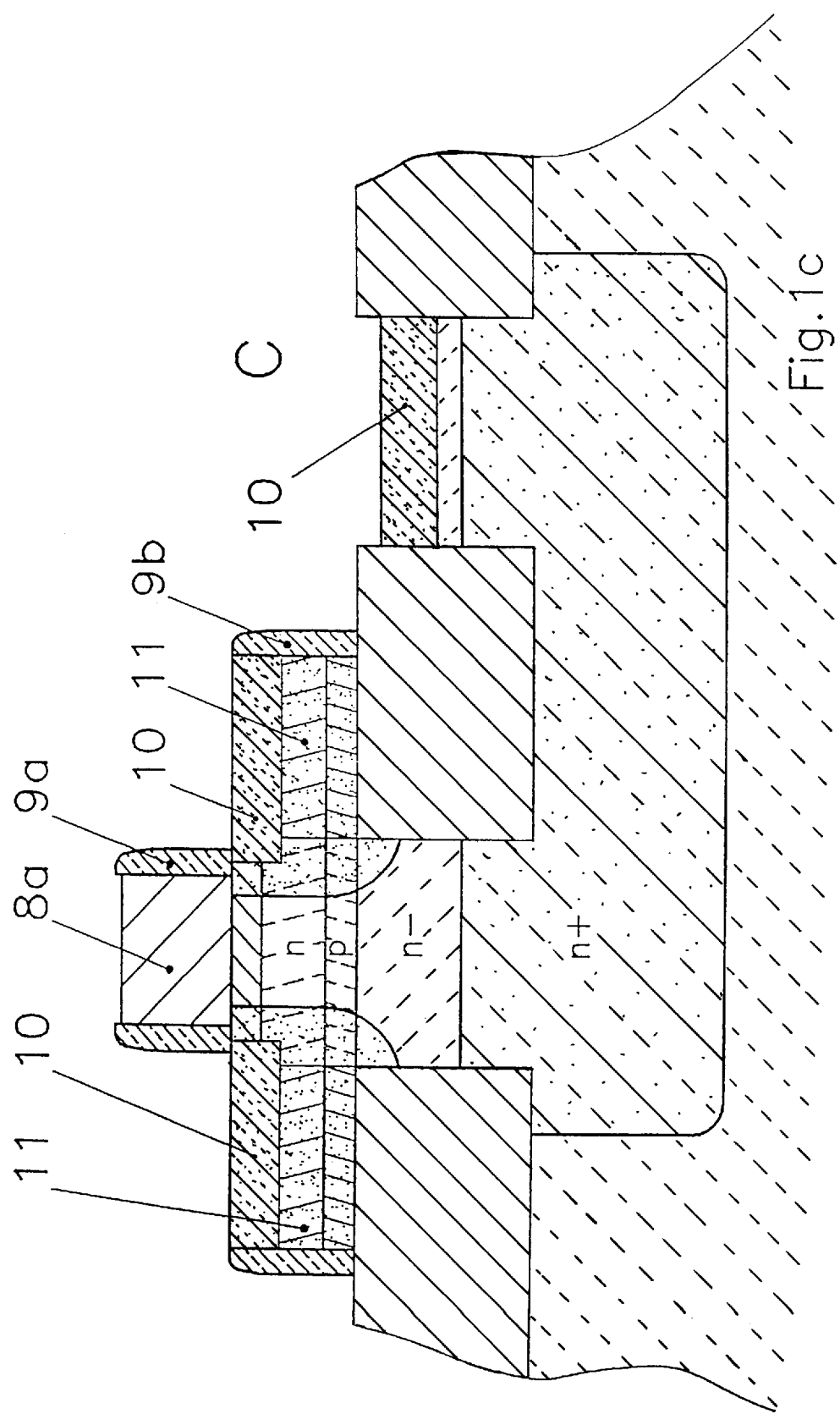

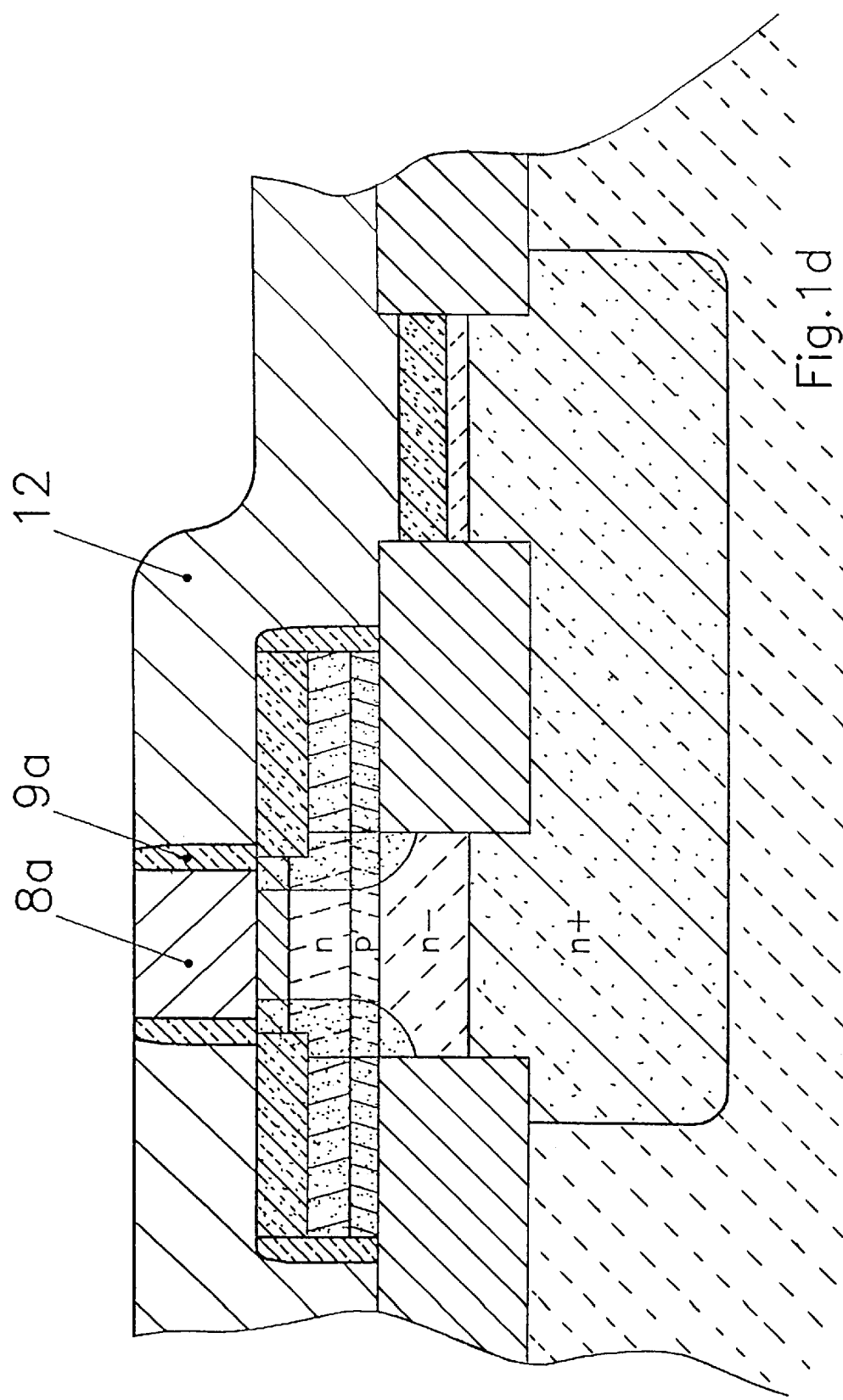

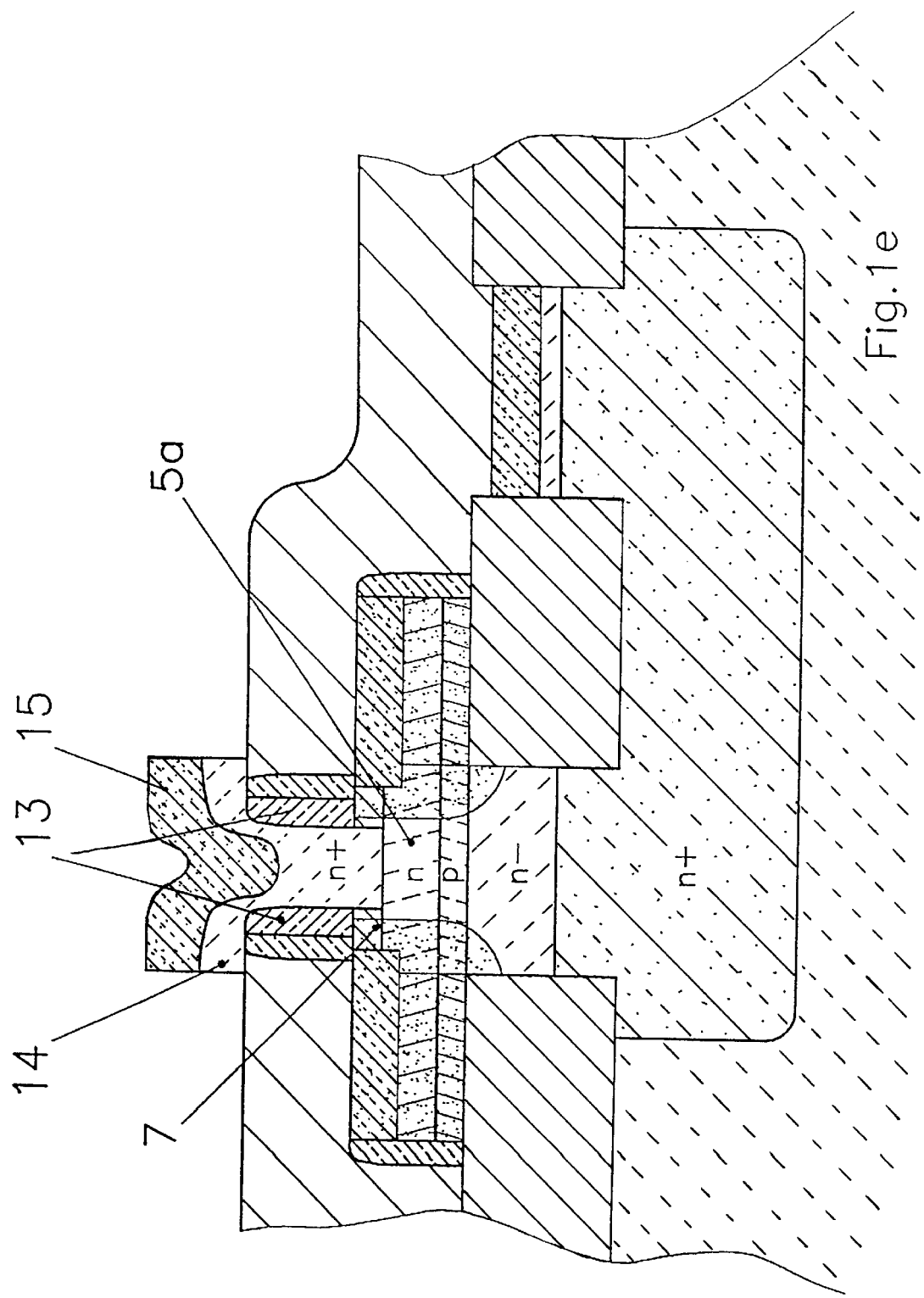

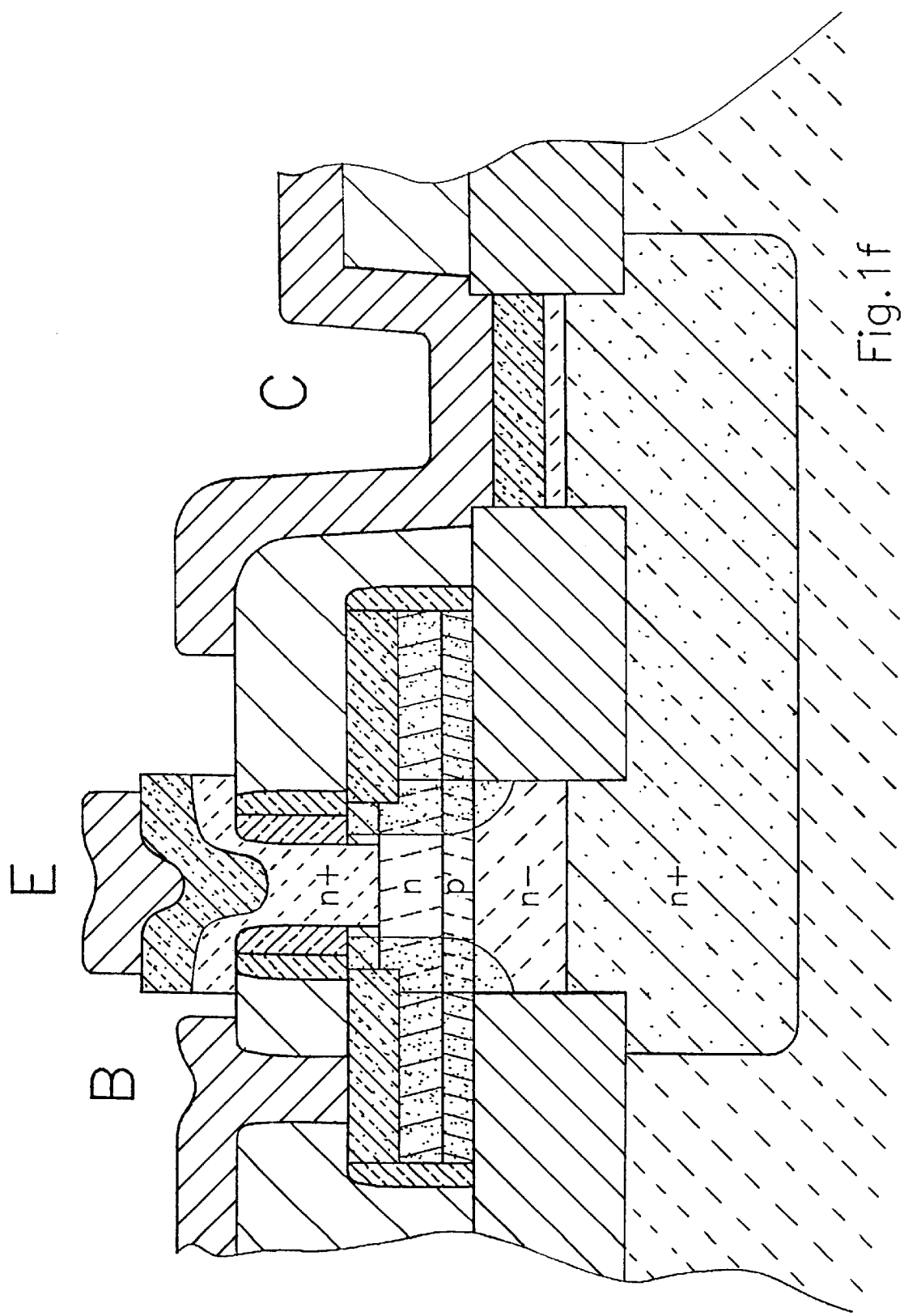

METHOD OF FABRICATING A HETEROBIPOLAR TRANSISTOR

REFERENCE TO RELATED APPLICATIONS

This application claims the priority of German application Serial No. 196 09 933, filed Mar. 14, 1996, which is incorporated herein by reference.

BACKGROUND OF THE INVENTION

The invention relates to a method of fabricating a heterobipolar transistor (HBT). More particularly, the present invention relates to a method of fabrication such a transistor wherein a patterned first layer having a collector region and isolation regions surrounding the collector is produced on a monocrystalline lead or conductor layer, and a monocrystalline transistor layer sequence is grown over the collector region, and simultaneously, a polycrystalline layer sequence is grown over the isolation regions.

The method according to the invention is used, in particular, for the fabrication of a SiGe HBT. At present, two different layer structures for a SiGe HBT are known. These two layers structures include an HBT having a lightly doped Si emitter and a higher doped SiGe base with abrupt, box-shaped Ge and dopant profiles, and an HBT having a layer structure with graduated Ge and dopant profiles in the manner of standard bipolar transistors. In the last-mentioned layer design, however, the advantages of the heterostructure cannot be fully exploited because, as in the standard bipolar transistor, the base layer resistance is scaled with the thickness of the base and is not almost independent of the base thickness as is the case in the SiGe HBT having box-shaped Ge and dopant profiles. This is primarily reflected in the maximum oscillation frequencies which are at considerably higher levels in the first mentioned version than in the second one.

But the drawback of the SiGe HBT having box-shaped Ge and dopant profiles is that, because of the steep Ge and dopant profiles, the structure reacts very sensitively to heat treatments, implantations and thermal oxidation procedures and, for this reason, a double mesa structure is most advantageous. But the mesa structure of the emitter has the drawback that the distance between the silicide co-forming the base conductor or lead and the base conductor/emitter junction must be defined by a double spacer. For this double spacer technology, high implantation energies are required which lead to defects in the base, and therewith have a negative influence on the layer quality and the transistor properties.

Moreover, it has not been possible so far to realize a poly-Si emitter on an HBT having box-shaped Ge and dopant profiles because this initiates an outdiffusion of the dopant (e.g., boron) from the base.

From a publication by J. N. Burghartz et al. in IEEE, 1993, Bipolar Circuits and Technology Meeting, pp. 55–62, the fabrication of a heterobipolar transistor is known having an SiGe base which is self-aligned. The SiGe base is highly doped and the emitter is lightly doped and the layers are produced by means of CVD. Amorphous silicon is used as the emitter contact material which is deposited over the entire surface (FIG. 1d) and then planarized. To define the emitter, an inside spacer is used which is ground so as to be planar with respect to $SiO_2$ openings. This results in a relatively small contact surface which increases the contact resistance of the emitter. Arsenic was used as the dopant material for the emitter contact, thus also resulting in a relatively high contact resistance.

Therefore, the object of the invention is a method of fabricating a heterobipolar transistor, which method is suited for mass production and by means of which HBT's can be produced having good layer qualities and low contact resistances.

SUMMARY OF THE INVENTION

The above object is achieved according to the present invention by a method of fabricating a heterobipolar transistor, comprising: on a monocrystalline lead layer, producing a patterned first layer having a collector region and having isolation regions surrounding the collector region; simultaneously growing a monocrystalline transistor base and emitter layer sequence over the collector region and a polycrystalline layer sequence over the isolation regions; covering the emitter layer of the monocrystalline transistor layer sequence with a suitable mask; using the mask, changing the doping and the conductivity type of the polycrystalline layer corresponding to the emitter layer to form a portion of a base lead, with the boundaries between the polycrystalline and monocrystalline material being included in the doping change; forming exterior oxide spacers at the vertical edges of the mask and of the base lead; subsequently carrying out a self-aligned, partial conversion of the base lead into a silicide so that the distance between the base lead/emitter junction and the silicide is determined by the spacer; removing the mask over the emitter region and forming an exside-inside spacer structure to define an emitter window over the emitter layer: and depositing a highly-doped, amorphous semiconductor material into the emitter window and onto the emitter layer to fabricate the emitter contact. Advantageous embodiments and/or modifications are disclosed and claimed.

The invention offers the advantage that the above-cited drawbacks are eliminated by way of an exside-inside spacer process with an amorphous Si emitter. Standard lithography methods for the self-aligned fabrication of emitter widths up to approx. 0.3 µm can be applied in an advantageous manner. Furthermore, the Si-mesa etching of the emitter is omitted, which means that the passivation of the device takes place on a clean surface. Since the present process requires much lower implantation energies than the double spacer technology, high layer qualities are accomplished and the transistor properties are improved.

By using an exside-inside spacer, the distance between the base lead (conductor)/emitter junction and the silicide which co-forms the base lead can be set precisely, thus preventing short-circuits.

The use of phosphorus for the doping of the amorphous Si emitter contact and the subsequent rapid annealing at temperatures exceeding 900° C. are also advantageous because, in this manner, the outdiffusion of boron from the base is prevented. Moreover, phosphorus-doped, amorphous silicon has a very low resistance.

In the following, the invention is described by way of an embodiment with reference to schematic drawings.

BRIEF DESCRIPTION OF THE DRAWINGS

FIGS. 1a to 1f illustrate the process sequence of an embodiment of the method according to the invention.

DETAILED DESCRIPTION OF THE DRAWINGS

Figure 1B:
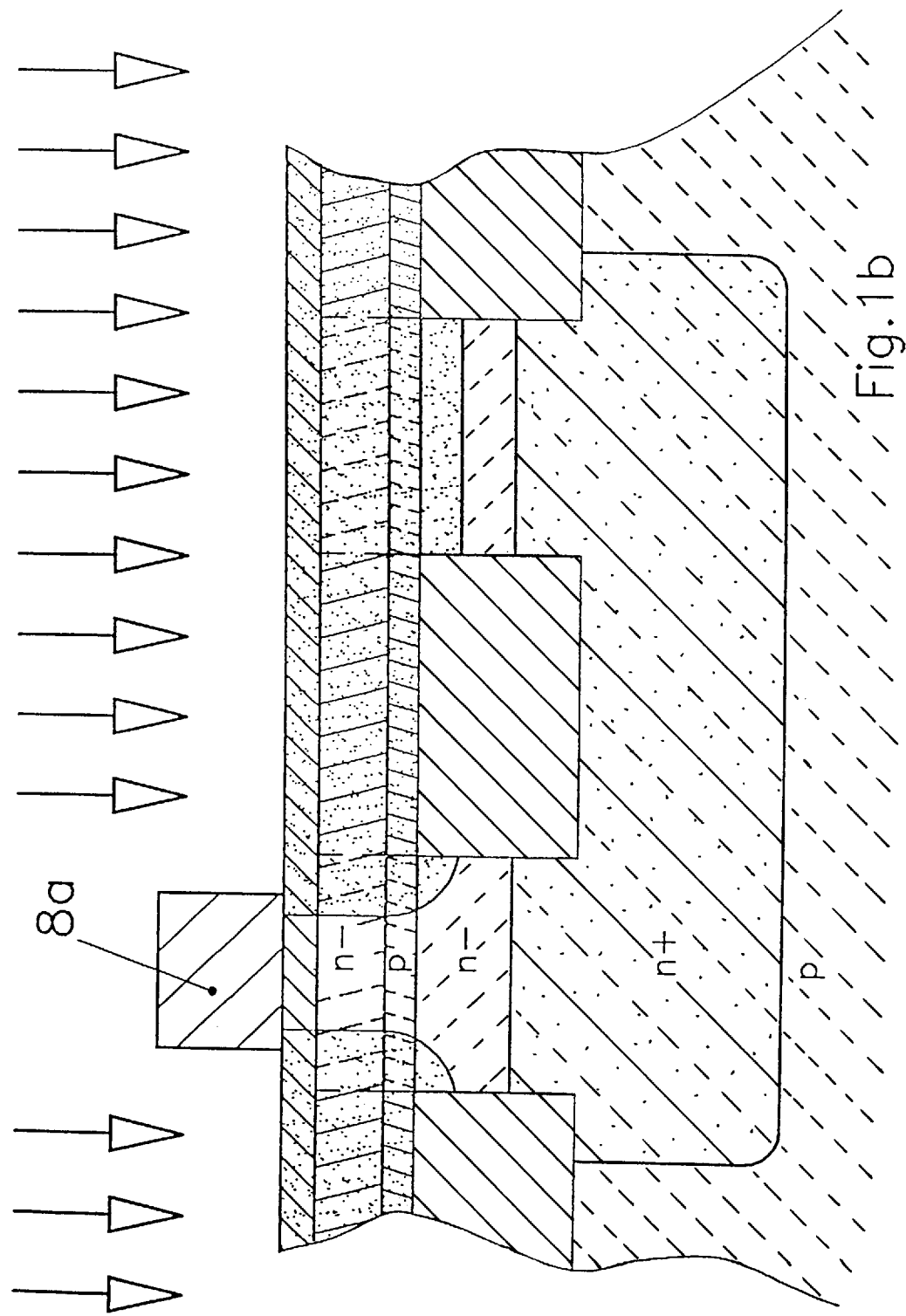

For the fabrication of the differential HBT, for example, according to FIG. 1a, an $n^+$-doped trough 2 is embodied as a collector lead layer in a p-doped Si substrate 1. A first layer, the collector layer 3, e.g., from n⁻-doped Si, is grown epitaxially onto the substrate 1 with trough 2. Into this first layer, isolation regions 6 are produced, e.g., by the use of photolithographic patterning and local oxidation of the silicon material (LOCOS or recessed LOCOS). Preferably, as shown, the isolation regions 6 reach into the substrate 1 or trough 2. Furthermore, and alternatively, it is possible by using selectively filling epitaxy to grow a first layer, the collector layer 3, from n⁻-doped Si in a structure of isolation regions 6 produced on a substrate 1 with a trough 2. Such methods are cited, e.g., in DE 44 17 916. For example, a p-doped SiGe layer 4 and an n-doped Si layer 5 are deposited sequentially on top of such a structure by way of a differential epitaxial process (MBE or CVD) (FIG. 1a). During this process, monocrystalline semiconductor material grows on the semiconductor material of the trough 2 in the regions between the isolation regions 6 made, e.g., from $SiO_2$, and polycrystalline semiconductor material grows on the $SiO_2$ isolation regions 6. This forms the monocrystalline regions comprising the respective SiGe and Si layers 4a, 5a, which form the base layer 4a and the emitter layer 5a, and respective polycrystalline SiGe and Si layers 4b, 5b. This layer sequence is thermally oxidized. Then, a double isolation layer 7, 8 comprised respectively of, e.g., $SiO_2$, and $Si_3N_4$ is applied to the surface (FIG. 1a).

From the $Si_3N_4$ layer 8, an emitter mask 8a is produced by using a lithography step and a plasma etching step as shown in FIG. 1b. By means of a subsequent implantation, e.g., with $BF_2$ at 40 keV and a surface doping of $6 \cdot 10^{15} cm^{-2}$, a doping change of the layer sequence with a conductivity type change of the layer portions 5a is effected such that only the portion covered by the mask 8a is not affected by the doping change as further shown in FIG. 1b. The boundaries between the polycrystalline and the monocrystalline material are included in the doping change. Thereafter, a rapid annealing is carried out and the base conductor or lead 11 and the collector terminal C are patterned by means of appropriate etching and lithography processes as shown in FIG. 1c. Then, the edges of the emitter mask 8a and the vertical edges of the base conductor or lead 11 are provided with spacers 9a, 9b, e.g., from $SiO_2$, as shown in FIG. 1c. Subsequently, a metal layer, e.g., of Ti, is deposited and a silicide layer 10 of, e.g., $TiSi_2$, is formed in the region of the base conductor or lead 11 and the collector terminal C. The silicide formation takes place in a self-adjusting manner because of the spacers 9a, 9b. The distance between the base conductor/emitter junction and the silicide layer is defined by the spacer 9a. The Ti layer is removed again, but not in the base region and the collector region.

Afterwards, as shown in FIG. 1d, an $SiO_2$ layer 12 is deposited over the entire surface and then the emitter window is reopened through the layer 12 by means of polish etching (chemical mechanical polishing (CMP)) as shown in FIG. 1e to expose the mask 8a. By use of a subsequent wet-chemical etching process, the mask 8a is removed in the window region and an inside spacer 13 is formed, e.g., from poly-Si or a combination of thin nitride and poly-Si on the inside of the spacers 9a. Here, it is of decisive importance that the plasma etching, which is necessary for the spacer fabrication, stops at the oxide layer 7 so that the emitter layer 5a is not affected by the plasma etching. The inside spacer 13 defines the emitter width, and emitter widths of, e.g., approx. 0.4 μm can be realized.

Afterwards, the oxide layer 7 in the emitter region is wet-chemically removed to expose the emitter layer 5a (see FIG. 1e). Amorphous Si then is deposited for the formation of an emitter contact layer 14. For the fabrication of an n⁺-doped emitter contact layer 14, the amorphous Si is doped with phosphorus and then a rapid annealing step is carried out. This rapid annealing step takes place at a temperature of more than 900° C. The emitter contact 14 is patterned so that it is wider than the window and extends over the outer surface for at least the width of the spacers 9a and onto the surface of the oxide layer 12. A silicide layer 15, e.g., with Ti, is then formed in addition on the amorphous Si layer 14 selectively with respect to the $SiO_2$ as shown in FIG. 1e. During such fabrication of an emitter contact 14,15, no problems at all occur at the junction of the amorphous Si contact layer 14 with the monocrystalline n-emitter layer 5a because the monocrystalline emitter layer 5a was not exposed to the plasma etching process and has a good layer quality. It is also advantageous that the active base/emitter junction was not determined by outdiffusion from the amorphous Si, but merely by the doping ratios during the epitaxial process.

Since the temperatures of the rapid annealing steps may exceed 900° C., which is above the permissible temperature for metastable SiGe layers, the method according to the invention is more temperature-stable than known methods of bipolar fabrication.

Thereafter, as shown in FIG. 1f, contact holes for the base terminal and the collector terminal are opened in the layer 12 and a standard metallization is applied to produce the collector, base and emitter contacts C, B, and E for the transistor.

The invention is not limited to the fabrication of an n-p-n HBT described in detail. Rather, it can be applied analogously to complementary doping and to conventional bipolar transistors. The semiconductor material is not limited to Si and SiGe. In particular, III/V semiconductor compounds may be used as well. The option of a "collector-on-top" arrangement also lends itself, wherein the sequence of the transistor layers is reversed.

A typical design for an SiGe HBT fabricated according to the invention is specified in the following numerical example:

a p-Si substrate 1 having a specific resistance of 20 Ωcm;

an Si collector region 2 having a layer resistance of 10 Ω/surface unit;

an Si collector layer 3 having an n⁻-doping concentration of $1 \cdot 10^{16}$ to $5 \cdot 10^{17} cm^{-3}$ and a layer thickness of 200 nm to 100 nm;

an SiGe base layer 4a having a p-doping concentration of $2 \cdot 10^{19} cm^{-3}$ and a layer thickness of 40 nm;

an Si emitter layer 5a having an n-doping concentration of $2 \cdot 10^{18} cm^{-3}$ and a layer thickness of 70 nm;

an amorphous Si emitter contact layer 14 having a layer thickness of 150 nm and a phosphorus implantation of $1 \cdot 10^{16} cm^{-2}$ at 20 keV;

an exside spacer 9a having a width of 150 nm;

an inside spacer 13 having a width of 100 nm;

silicide layers from $TiSi_2$ having a layer thickness of 50 nm; and a metallization of the contacts C, B, E with an AlTiSi layer or AlSiCu layer having a layer thickness of 1 μm.

For the fabrication of a collector layer 3, it is also advantageous to carry out an additional doping through the emitter opening without a further mask after the inside spacer etching, e.g., by means of phosphorus with a surface doping of $5 \cdot 10^{12} cm^{-2}$ at 100 keV (selective implanted collector).

The invention now being fully described, it will be apparent to one of ordinary skill in the art that any changes and modifications can be made thereto without departing from the spirit or scope of the invention as set forth herein.

What is claimed:

1. A method of fabricating a heterobipolar transistor, comprising the steps of:

on a monocrystalline lead layer, producing a patterned first layer having a collector region and having isolation regions surrounding the collector region;

simultaneously growing a monocrystalline transistor base and emitter layer sequence over the collector region and, a polycrystalline layer sequence over the isolation regions;

covering the emitter layer of the monocrystalline transistor layer sequence with a suitable mask;

using the mask, changing the doping and the conductivity type of the polycrystalline layer corresponding to the emitter layer to form a portion of the base lead, with the boundaries between the polycrystalline and monocrystalline material being included in the doping change;

forming exterior oxide spacers at the vertical edges of the mask and of the base lead;

subsequently carrying out a self-aligned, partial conversion of the base lead into a silicide so that the distance between base conductor/emitter junction and the silicide is determined by the spacer;

removing the mask over the emitter region and forming an exside-inside spacer structure to define an emitter window over the emitter layer; and depositing highly-doped, amorphous semiconductor material into the emitter window and onto the emitter layer to fabricate an emitter contact.

2. A method according to claim 1, wherein the heterobipolar transistor is formed from an Si/SiGe heterostructure having a p-doped SiGe base and a lightly n-doped Si emitter.

3. A method according to claim 1, wherein said step of covering the emitter layer includes applying an oxide-nitride double layer on top of the transistor layer sequence, and producing a nitride mask which is suitable for the definition of the emitter by use of a lithography and etching step while the oxide layer remains intact as a protective layer for the emitter layer.

4. A method according to claim 1, wherein the portion of the base lead is produced by $BF_2$ implantation of the polycrystalline layer sequence followed by a subsequent rapid annealing.

5. A method according to claim 1, wherein said step of removing the mask over the emitter region comprises:

covering, the entire structure with a layer of $SiO_2$, opening an emitter window in the $SiO_2$ by use of polish etching;

subsequently, wet-chemically removing the nitride mask via the emitter window and such that the etching agent stops at the oxide layer on the surface of the emitter layer, producing inside spacers on the vertical edges of the emitter opening by deposition of polysilicon and subsequent etching, and wet-chemically removing the oxide layer protecting the emitter layer; and wherein said step of depositing a highly-doped, amorphous silicon material includes depositing the amorphous silicon as an emitter contact layer on top of the emitter layer in the emitter opening, and then carrying out a rapid annealing step.

6. A method according to claim 5, further comprising implantation the emitter contact layer with phosphorus at energies of 20 keV and with a surface doping of $10^{16} cm^{-2}$.

7. A method according to claim 5, wherein the rapid annealing of the emitter contact is carried out at a temperature of more than 900° C.

8. A method according to claim 5, wherein emitter widths up to 0.3 $\mu$m are provided by using the inside spacer.

9. A method according to claim 1, wherein the amorphous silicon of the emitter contact layer extends beyond the emitter window width and, thus produces a larger contact surface; and further comprising applying a silicide layer on the emitter contact.

10. A method according to claim 1, wherein the transistor layers are grown in reverse sequence, and the collector and emitter terminal are interchanged.

* * * * *